(12) United States Patent
Mollard et al.

(10) Patent No.: US 10,944,077 B2
(45) Date of Patent: Mar. 9, 2021

(54) PROCESS FOR MANUFACTURING A PIXEL OF AN OLED MICRO-DISPLAY

(71) Applicant: Commissariat A L'Energie Atomique et aux Energies Alternatives, Paris (FR)

(72) Inventors: Laurent Mollard, Grenoble (FR); Tony Maindron, Grenoble (FR); Myriam Tournaire, Grenoble (FR)

(73) Assignee: Commissariat A L'Energie Atomique et aux Energies Alternatives, Paris (FR)

( * ) Notice: Subject to any disclaimer, the term of this patent is extended or adjusted under 35 U.S.C. 154(b) by 0 days.

(21) Appl. No.: 16/711,541

(22) Filed: Dec. 12, 2019

(65) Prior Publication Data

US 2020/0203662 A1    Jun. 25, 2020

(30) Foreign Application Priority Data

Dec. 19, 2018 (FR) ...................................... 1873304

(51) Int. Cl.
*H01L 51/52* (2006.01)
*H01L 51/00* (2006.01)
(Continued)

(52) U.S. Cl.
CPC ...... *H01L 51/5265* (2013.01); *H01L 51/0018* (2013.01); *H01L 51/5044* (2013.01);
(Continued)

(58) Field of Classification Search
None
See application file for complete search history.

(56) References Cited

U.S. PATENT DOCUMENTS

2007/0102737 A1    5/2007  Kashiwabara et al.
2011/0031515 A1*   2/2011  Mizuno .................. H05B 33/14
                                                      257/89
(Continued)

FOREIGN PATENT DOCUMENTS

EP          1 672 962 A1     6/2006

OTHER PUBLICATIONS

French Preliminary Search Report dated Oct. 4, 2019 in French Application 18 73304 filed Dec. 19, 2018 (with English Translation of Categories of Cited Documents & Written Opinion), citing documents AA-AI & AO therein, 10 pages.

*Primary Examiner* — Asok K Sarkar
(74) *Attorney, Agent, or Firm* — Oblon, McClelland, Maier & Neustadt, L.L.P.

(57) ABSTRACT

A process includes the following successive steps: a) providing a substrate including a structured first electrode; b) forming in succession first and second bilayer stacks on the structured first electrode, each bilayer stack including in succession first and second layers made of first and second materials that are transparent conductive oxides able to be selectively etched; c) etching the second bilayer stack in a zone intended to accommodate a blue subpixel and in a zone intended to accommodate a green subpixel; d) etching the first bilayer stack in the zone intended to accommodate the blue subpixel; e) forming a stack of organic light-emitting layers, the stack being configured to emit white light; f) forming a second electrode on the stack of organic light-emitting layers so as to obtain an optical resonator with the first electrode.

12 Claims, 6 Drawing Sheets

(51) Int. Cl.
*H01L 51/50* (2006.01)
*H01L 51/56* (2006.01)
(52) U.S. Cl.
CPC ...... *H01L 51/5206* (2013.01); *H01L 51/5221* (2013.01); *H01L 51/56* (2013.01); *H01L 2251/301* (2013.01); *H01L 2251/305* (2013.01); *H01L 2251/306* (2013.01); *H01L 2251/558* (2013.01)

(56) References Cited

U.S. PATENT DOCUMENTS

| | | |
|---|---|---|
| 2011/0241038 A1 | 10/2011 | Kashiwabara et al. |
| 2013/0207138 A1 | 8/2013 | Kashiwabara et al. |
| 2014/0284565 A1* | 9/2014 | Park .................... H01L 51/0013 257/40 |
| 2014/0332832 A1 | 11/2014 | Kashiwabara et al. |
| 2015/0137082 A1* | 5/2015 | Kim .................... H01L 51/5262 257/40 |
| 2015/0295017 A1 | 10/2015 | Kashiwabara et al. |
| 2016/0013412 A1* | 1/2016 | Harikrishna Mohan .................... H01L 51/525 438/29 |
| 2016/0293673 A1 | 10/2016 | Kashiwabara et al. |
| 2017/0154932 A1 | 6/2017 | Kashiwabara et al. |
| 2017/0243928 A1 | 8/2017 | Yang |
| 2018/0197923 A1 | 7/2018 | Kashiwabara et al. |
| 2018/0226456 A1* | 8/2018 | Hsu .................... H01L 51/5072 |
| 2018/0254303 A1* | 9/2018 | Mishima ............. H01L 51/5265 |
| 2020/0144335 A1* | 5/2020 | Quan .................... H01L 51/56 |

* cited by examiner

PROCESS FOR MANUFACTURING A PIXEL OF AN OLED MICRO-DISPLAY

TECHNICAL FIELD

The invention relates to the technical field of OLED micro-displays (OLED being the acronym of organic light-emitting diode).

The invention is notably applicable to the manufacture of augmented- or virtual-reality headsets and glasses, camera viewfinders, head-up displays, pico-projectors, etc.

PRIOR ART

A pixel of a top-emitting OLED micro-display known in the prior art, notably from document EP 1 672 962 A1, comprises, in succession:
- a substrate;
- a first electrode, which is reflective in the visible domain and formed on the substrate;
- a spacer layer, formed on the first electrode;
- a stack of organic light-emitting layers, said stack being configured to emit white light and formed on the spacer layer,
- a second electrode, which is semi-transparent in the visible domain and formed on the stack; the first and second electrodes forming an optical resonator.

The spacer layer possesses first, second and third segments having thicknesses chosen so that the optical resonator respectively permits the transmission of red, green and blue light (obtained from the white light emitted by the stack) so as to respectively define red, green and blue subpixels.

Such a prior-art pixel, by virtue of the Fabry-Perot optical resonator, which forms an interference filter, makes it possible to envisage not using colour filters. The range of wavelengths filtered is defined by the thicknesses of the first, second and third segments of the spacer layer, allowing the thickness of the optical cavity (bounded by the first and second electrodes) to be adjusted so that the optical resonator respectively permits the transmission of red, green and blue light (obtained from the white light emitted by the stack of organic light-emitting layers).

This type of filtering may be obtained in an analogous way in a bottom-emitting micro-display. To simplify the terminology, reference will still be made to a resonator, even though interference effects are much smaller in the case of bottom emission.

However, such a prior-art pixel is not entirely satisfactory in so far as the first, second and third segments of the spacer layer are formed on the first electrode by successive depositions, this possibly leading to a problem with the precision to which their thicknesses may be controlled.

Moreover, it is known from document US 2005/0142976 A1 to use:
- a polycrystalline ITO layer for the third segment of the spacer layer (blue subpixel),
- a stack of two polycrystalline ITO layers for the second segment of the spacer layer (green subpixel),
- a stack of three polycrystalline ITO layers for the first segment of the spacer layer (red subpixel).

In the manufacturing process, a first polycrystalline ITO layer is formed on the first electrode then a first amorphous ITO layer is deposited (wafer-scale deposition) on the first polycrystalline ITO layer. The first amorphous ITO layer is then selectively etched—with a suitable etchant—in a zone intended to accommodate a blue subpixel, the first polycrystalline ITO layer forming a stop layer. Next, a thermal anneal is applied to the first amorphous ITO layer in order to form a second polycrystalline ITO layer.

Analogously, a second amorphous ITO layer is deposited (wafer-scale deposition) then selectively etched:
- in the zone intended to accommodate the blue subpixel, the first polycrystalline ITO layer forming a stop layer, and
- in a zone intended to accommodate a green subpixel, the second polycrystalline ITO layer forming a stop layer.

Lastly, a thermal anneal is applied to the second amorphous ITO layer in order to form a third polycrystalline ITO layer.

Such a prior-art process allows the thickness of the spacer layer for the red, green and blue subpixels to be very satisfactorily controlled. However, such a prior-art technique is not entirely satisfactory in terms of manufacturing time and ease of implementation. Specifically, the depositing and etching phases cannot be carried out rapidly one after the other because of the thermal anneals that must be applied to the amorphous ITO.

SUMMARY OF THE INVENTION

The invention aims to remedy all or some of the aforementioned drawbacks. To this end, the subject of the invention is a process for manufacturing a pixel of an organic-light-emitting-diode micro-display, comprising the following successive steps:
a) providing a substrate comprising a structured first electrode;
b) forming in succession first and second bilayer stacks on the structured first electrode, each bilayer stack comprising in succession first and second layers respectively made of first and second materials that are transparent conductive oxides able to be selectively etched;
c) etching the second bilayer stack in a zone intended to accommodate a blue subpixel and in a zone intended to accommodate a green subpixel, the second bilayer stack being left intact under a zone intended to accommodate a red subpixel;
d) etching the first bilayer stack in the zone intended to accommodate the blue subpixel, the first bilayer stack being left intact under the zone intended to accommodate the green subpixel;
e) forming a stack of organic light-emitting layers, said stack being configured to emit white light and extending through the zones intended to accommodate the red, green and blue subpixels;
f) forming a second electrode on the stack of organic light-emitting layers so as to obtain an optical resonator with the first electrode;

step b) being executed so that:
the first bilayer stack has a thickness chosen so that the optical resonator permits the transmission of green light,
the first and second bilayer stacks have a total thickness chosen so that the optical resonator permits the transmission of red light.

Thus, such a process according to the invention allows the thicknesses of the bilayer stacks to be satisfactorily controlled by virtue of step b), which permits wafer-scale depositions to be carried out, and by virtue of the etching steps c) and d). Furthermore, such a process according to the invention allows a phase of depositing—step b)—and phases of etching—steps c) and d)—the bilayer stacks to be carried out one after the other (the interruptions required for the thermal anneals in the prior art not being necessary) this creating additional latitude with respect to the control of the thicknesses. Such a process according to the invention therefore decreases manufacturing time and increases ease of implementation.

Definitions

By "micro-display" what is meant is a display each pixel of which has an area smaller than or equal to 30 μm by 30 μm.

By "substrate", what is meant is a self-supporting physical carrier made of a basic material that preferably allows an electronic device or an electronic component to be integrated. For example, a substrate is conventionally a wafer cut from a single-crystal semiconductor ingot.

By "bilayer stack" what is meant is either a single bilayer structure comprising first and second layers in succession, or a set of (e.g. from 2 to 4) stacked bilayer structures each successively comprising first and second layers.

By "structured electrode" what is meant is an electrode having a discontinuous surface delineating a set of patterns.

By "transparent conductive oxide" what is meant is an oxide possessing: an intensity transmission coefficient higher than or equal to 70%, preferably higher than or equal to 80%, more preferably higher than or equal to 85% and even more preferably higher than or equal to 90%, averaged over the visible domain, and an electrical conductivity at 300 K higher than or equal to $10^2$ S/cm.

By "visible domain" what is meant is an electromagnetic spectrum comprised between 380 nm and 780 nm.

By "selectively etched" what is meant is that the second material may be etched without etching the first material, and vice versa. In practice, the etchant is chosen so that the etch rate of the second material (of the first material, respectively) is at least ten times higher than that of the first material (of the second material, respectively).

By "thickness" what is meant is the dimension along the normal to the surface of the pixel or of the subpixel.

The method according to the invention may comprise one or more of the following features.

According to one feature of the invention, step a) comprises a step consisting in coating the structured first electrode with an intermediate layer made of the second material, the intermediate layer having a thickness chosen so that the optical resonator permits the transmission of blue light;
step b) being executed so that:
the first bilayer stack and the intermediate layer have a total thickness chosen so that the optical resonator permits the transmission of green light,
the first and second bilayer stacks and the intermediate layer have a total thickness chosen so that the optical resonator permits the transmission of red light.

Thus, one advantage of such an intermediate layer is that it allows the structured first electrode to be protected before step b), i.e. it plays an encapsulating role. To this end, a second material allowing the structured first electrode to be protected from air and moisture will preferably be chosen.

According to one feature of the invention, the first material is a zinc oxide ZnO, preferably doped with aluminium, and the second material is tin oxide $SnO_2$.

Thus, such first and second materials may be selectively etched if a suitable etchant is chosen, a suitable etchant for example being hydrochloric acid 0.1%, which allows ZnO to be selectively etched with respect to $SnO_2$. Furthermore, such first and second materials have very similar refractive indices, this allowing reflections at the interface between the first and second layers of the bilayer stacks to be avoided.

According to one feature of the invention, step c) comprises the following successive steps:
$c_1$) etching the tin oxide $SnO_2$ of the second bilayer stack with a dry or wet etch,
$c_2$) etching the zinc oxide ZnO of the second bilayer stack with a wet etch.

According to one feature of the invention, step d) comprises the following successive steps:
$d_1$) etching the tin oxide $SnO_2$ of the first bilayer stack with a dry or wet etch,
$d_2$) etching the zinc oxide ZnO of the first bilayer stack with a wet etch.

According to one feature of the invention, step c) comprises a step $c_0$) consisting in masking the zone intended to accommodate the red subpixel with a photoresist.

Thus, one procured advantage is that it is possible to leave the second bilayer stack intact under the zone intended to accommodate the red subpixel.

According to one feature of the invention, step d) comprises a step do) consisting in masking the zone intended to accommodate the green subpixel with a photoresist.

Thus, one procured advantage is that it is possible to leave the first bilayer stack intact under the zone intended to accommodate the green subpixel.

According to one feature of the invention, step e) is preceded by a step $e_0$) consisting in etching the first and second bilayer stacks in the zones intended to lie between the red, green and blue subpixels.

Thus, one procured advantage is that it is possible to electrically insulate the red, green and blue subpixels from one another.

According to one feature of the invention, step b) is executed so that:
the first layer of each bilayer stack has a thickness comprised between 10 nm and 100 nm,
the second layer of each bilayer stack has a thickness smaller than or equal to 10 nm.

According to one feature of the invention, the first and second electrodes are made of a metal, preferably selected from Al, Ag, Pt, Cr, Ni and W, and/or made of a transparent conductive oxide.

Such metals possess both a high intensity reflection coefficient in the visible domain, and a high electrical conductivity. An oxide that is electrically conductive and transparent in the visible domain will be preferred when the electrode must be transparent or semi-transparent.

According to one feature of the invention, the substrate provided in step a) is transparent in the visible domain, the structured first electrode provided in step a) is semi-transparent in the visible domain, and the second electrode formed in step f) is reflective in the visible domain.

By "transparent" what is meant is that the substrate possesses an intensity transmission coefficient higher than or equal to 70%, preferably higher than or equal to 80%, more preferably higher than or equal to 85%, and even more preferably higher than or equal to 90%, averaged over the visible domain.

By "semi-transparent" what is meant is that the structured first electrode possesses a an intensity transmission coefficient comprised between 30% and 70% averaged over the visible domain.

By "reflective" what is meant is that the second electrode possesses an intensity reflection coefficient higher than or equal to 70%, preferably higher than or equal to 80%, more preferably higher than or equal to 85% and even more preferably higher than or equal to 90%, averaged over the visible domain.

Thus, one procured advantage is that a so-called bottom-emitting structure, i.e. one that emits toward the substrate, is obtained.

According to one feature of the invention, the substrate provided in step a) is made of a semiconductor, preferably silicon, or made of glass, the structured first electrode provided in step a) is reflective in the visible domain, and the second electrode formed in step f) is semi-transparent in the visible domain.

By "semiconductor" what is meant is a material that has an electrical conductivity of 300 Kelvin comprised between $10^{-8}$ S·cm$^{-1}$ and $10^{2}$ S·cm$^{-1}$.

By "reflective" what is meant is that the structured first electrode possesses an intensity reflection coefficient higher than or equal to 70%, preferably higher than or equal to 80%, more preferably higher than or equal to 85% and even more preferably higher than or equal to 90%, averaged over the visible domain.

By "semi-transparent" what is meant is that the second electrode possesses an intensity transmission coefficient comprised between 30% and 70%, averaged over the visible domain.

Thus, one procured advantage is that a so-called top-emitting structure, i.e. one that emits through the second electrode, is obtained. The substrate may then comprise a circuit for controlling the red, green and blue subpixels without adversely affecting the luminous efficacy of the micro-display. A TFT (acronym of thin-film transistor) circuit will be chosen when the substrate is made of glass, and a CMOS (acronym of complementary metal-oxide-semiconductor) circuit will be chosen when the substrate is made of a semiconductor, in particular Si.

BRIEF DESCRIPTION OF THE DRAWINGS

Other features and advantages will become apparent from the detailed description of various embodiments of the invention, the description being accompanied by examples and references to the appended drawings.

FIG. 1 is a schematic cross-sectional view cut normal to the substrate, illustrating one step of a process according to the invention.

FIG. 2 is a schematic cross-sectional view cut normal to the substrate, illustrating one step of a process according to the invention.

FIG. 3 is a schematic cross-sectional view cut normal to the substrate, illustrating one step of a process according to the invention.

FIG. 4 is a schematic cross-sectional view cut normal to the substrate, illustrating one step of a process according to the invention.

FIG. 5 is a schematic cross-sectional view cut normal to the substrate, illustrating one step of a process according to the invention.

FIG. 6 is a schematic cross-sectional view cut normal to the substrate, illustrating one step of a process according to the invention.

FIG. 7 is a schematic cross-sectional view cut normal to the substrate, illustrating one step of a process according to the invention.

FIG. 8 is a schematic cross-sectional view cut normal to the substrate, illustrating one step of a process according to the invention.

FIG. 9 is a schematic cross-sectional view cut normal to the substrate, illustrating one step of a process according to the invention.

FIG. 10 is a schematic cross-sectional view cut normal to the substrate, illustrating one step of a process according to the invention.

FIG. 11 is a schematic cross-sectional view cut normal to the substrate, illustrating one step of a process according to the invention.

FIG. 12 is a schematic cross-sectional view cut normal to the substrate, illustrating one step of a process according to the invention.

FIG. 13 is a schematic cross-sectional view cut normal to the substrate, illustrating one step of a process according to the invention.

FIG. 14 is a schematic cross-sectional view cut normal to the substrate, illustrating one step of a process according to the invention.

FIG. 15 is a schematic cross-sectional view cut normal to the substrate, illustrating one step of a process according to the invention.

Figure 1:
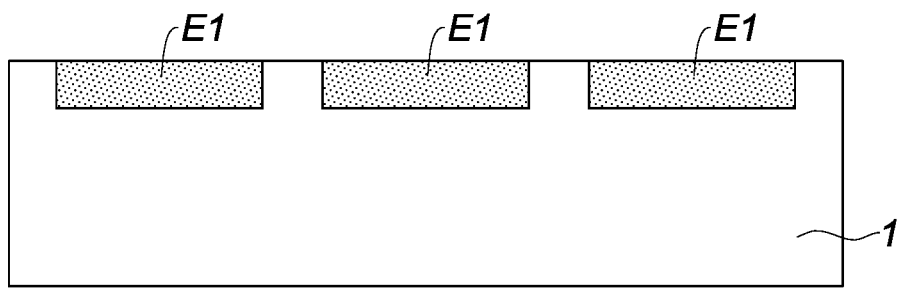
FIGS. 1 to 15 are schematic cross-sectional views cut normal to the substrate, illustrating steps of a process according to the invention.

It will be noted that the drawings described above are schematic and are not to scale for the sake of readability and to simplify the comprehension thereof.

DETAILED DESCRIPTION OF EMBODIMENTS

For the sake of simplicity, in the various embodiments elements that are identical or that have form the same function have been referenced with the same references.

As illustrated in FIGS. 1 to 15, the subject of the invention is a process for manufacturing a pixel of an organic light-emitting-diode micro-display, comprising the following successive steps:

a) providing a substrate 1 comprising a structured first electrode E1;

b) forming in succession first and second bilayer stacks 2, 3 on the structured first electrode E1, each bilayer stack 2, 3 comprising in succession first and second layers 20, 21; 30, 31 respectively made of first and second materials that are transparent conductive oxides able to be selectively etched;

c) etching the second bilayer stack 3 in a zone intended to accommodate a blue subpixel PB and in a zone intended to accommodate a green subpixel PV, the second bilayer stack 3 being left intact under a zone intended to accommodate a red subpixel PR;

d) etching the first bilayer stack 2 in the zone intended to accommodate the blue subpixel PB, the first bilayer stack 2 being left intact under the zone intended to accommodate the green subpixel PV;

e) forming a stack 5 of organic light-emitting layers, said stack being configured to emit white light and extending through the zones intended to accommodate the red, green and blue subpixels PR, PV, PB;

f) forming a second electrode E2 on the stack 5 of organic light-emitting layers so as to obtain an optical resonator with the first electrode E1;

step b) being executed so that:

the first bilayer stack 2 has a thickness chosen so that the optical resonator permits the transmission of green light, the first and second bilayer stacks 2, 3 have a total thickness chosen so that the optical resonator permits the transmission of red light.

Figure 3:
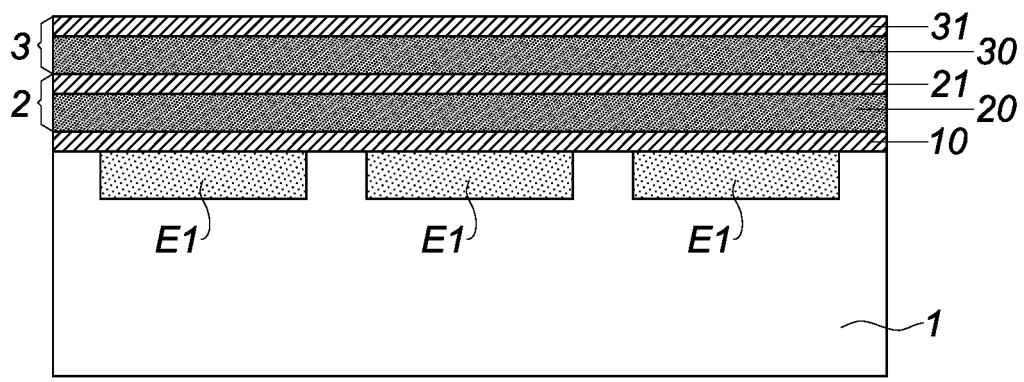
Figure 4:
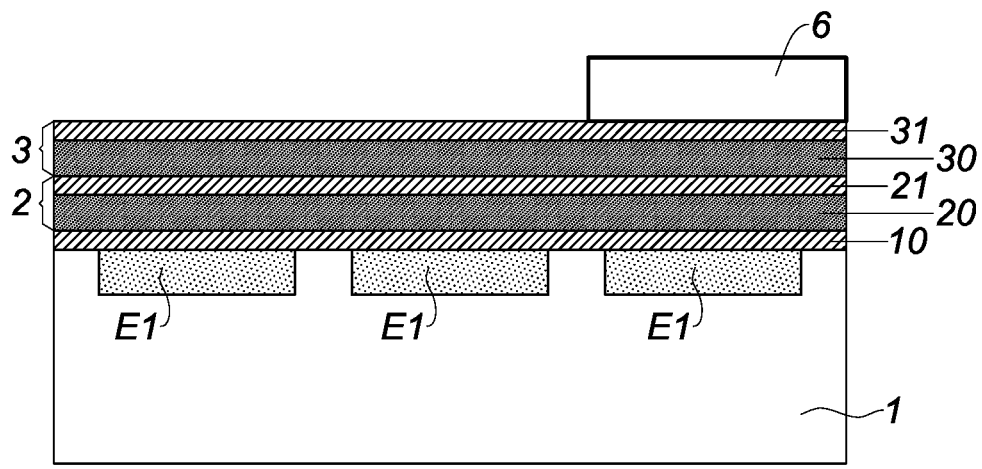
Figure 5:
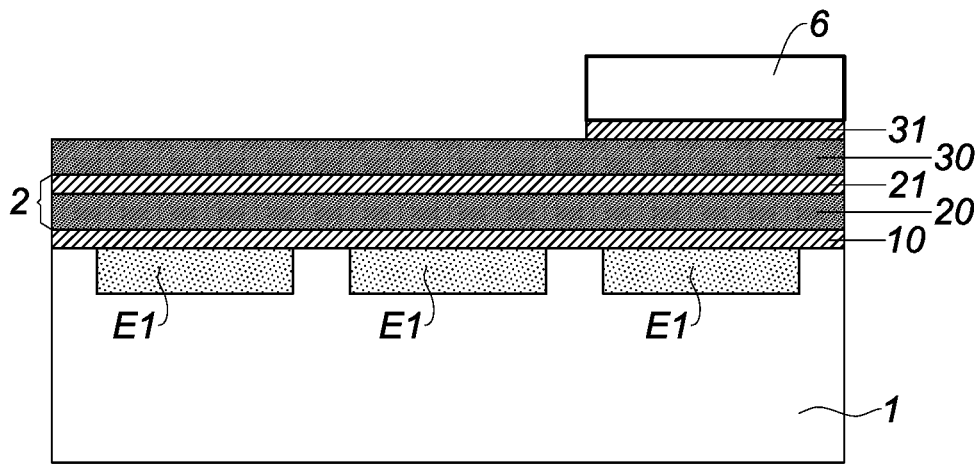
Figure 6:
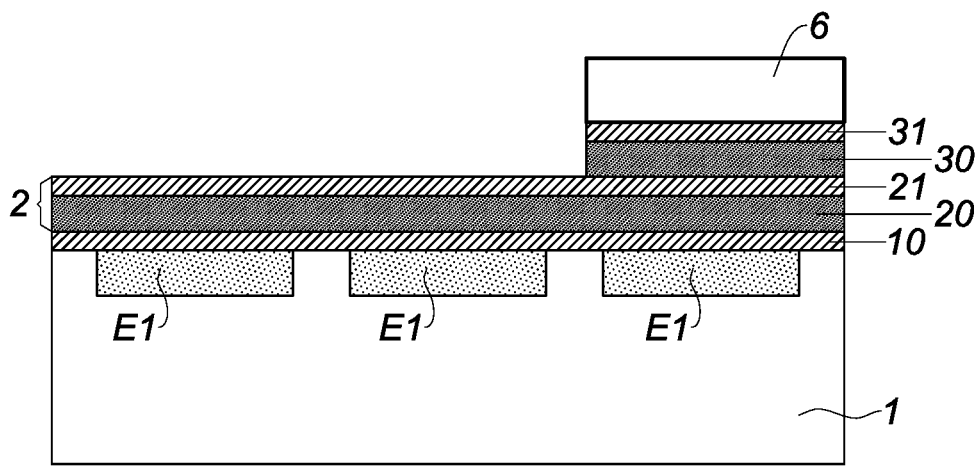
Figure 7:
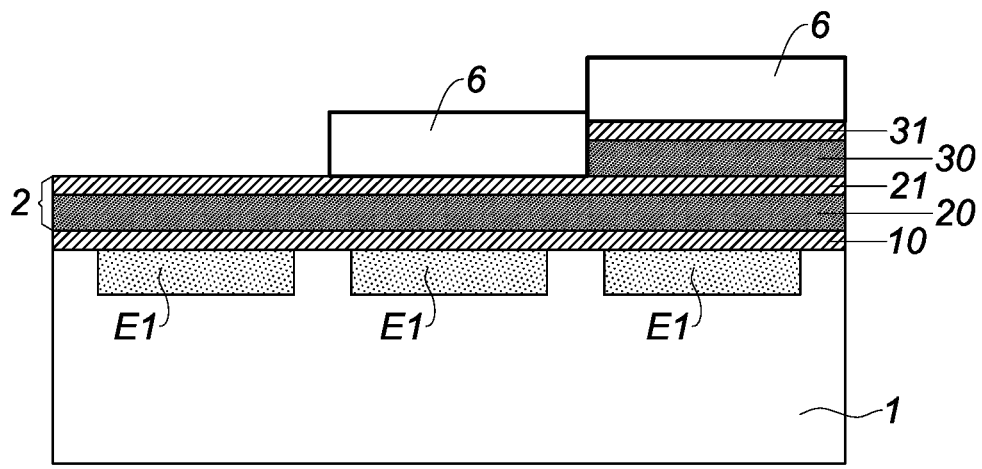
Figure 8:
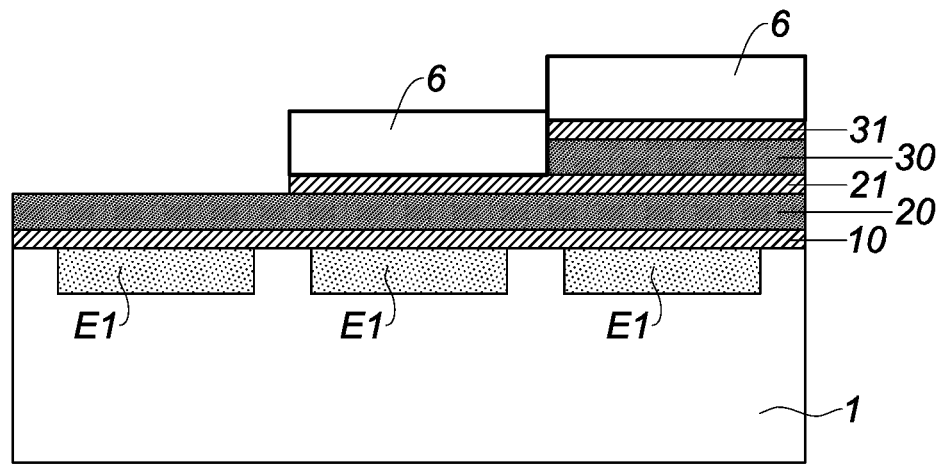
Figure 9:
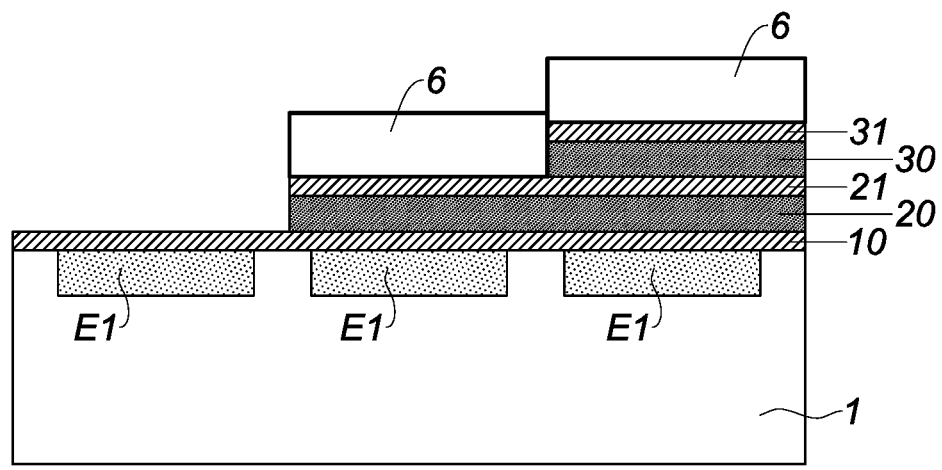
Figure 14:
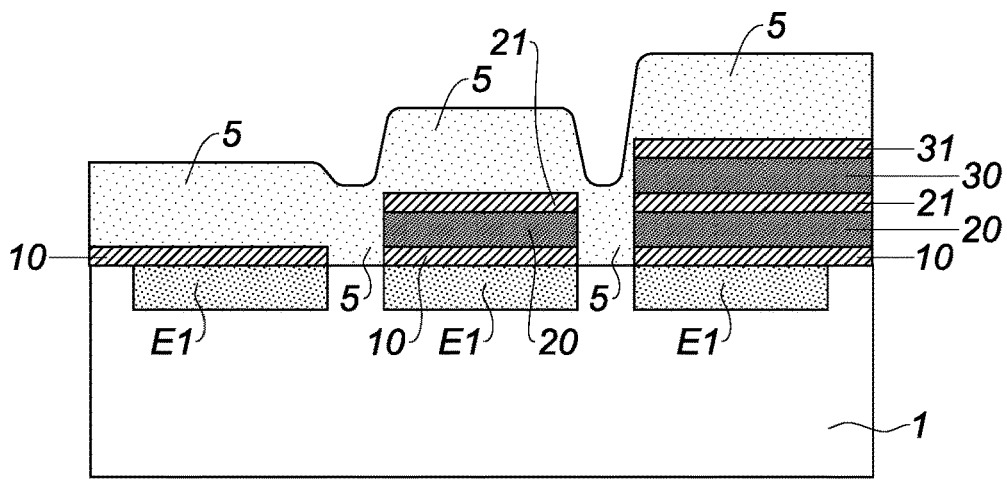
Figure 15:
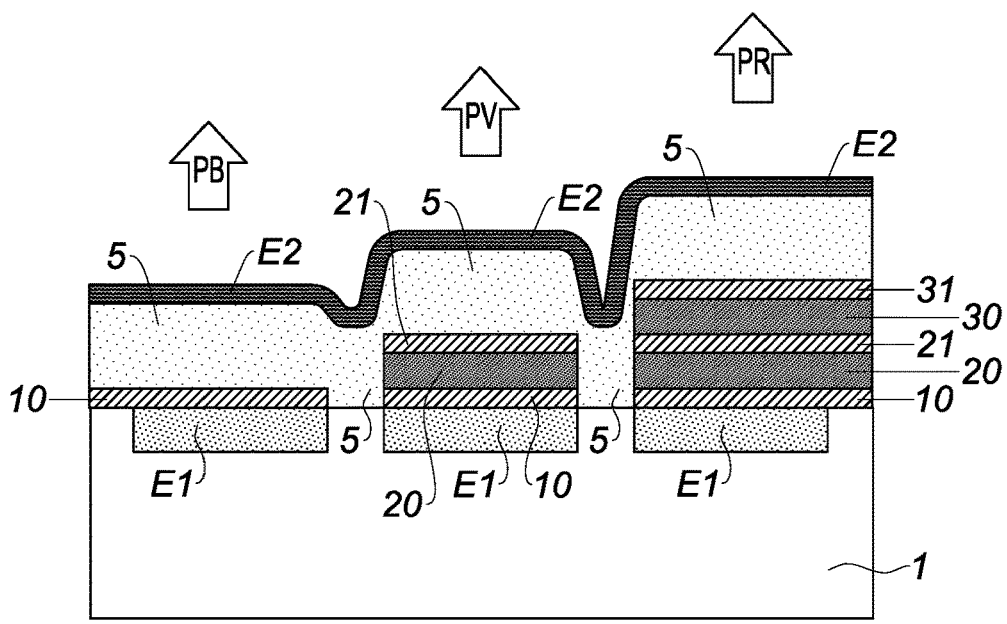

Step a) is illustrated in FIG. 1. Step b) is illustrated in FIG. 3. Step c) is illustrated in FIGS. 4 to 6. Step d) is illustrated in FIGS. 7 to 9. Step e) is illustrated in FIG. 14. Step f) is illustrated in FIG. 15.

Substrate and Types of Architectures

In a so-called bottom-emitting first architecture:

the substrate 1 provided in step a) is transparent in the visible domain, and may be made of glass, the structured first electrode E1 provided in step a) is semi-transparent in the visible domain, and may for example be made of a transparent conductive oxide, the second electrode E2 formed in step f) is reflective in the visible domain, and may for example be made of a metal.

In a so-called top-emitting second architecture:

the substrate 1 provided in step a) is made of a semiconductor, preferably silicon, or made of glass, the structured first electrode E1 provided in step a) is reflective in the visible domain, and may for example be made of a metal, the second electrode E2 formed in step f) is semi-transparent in the visible domain, and may for example be made of a transparent conductive oxide.

Structured First Electrode

The structured first electrode E1 is advantageously made of a metal, preferably selected from Al, Ag, Pt, Cr, Ni, W, Mo, Ti, Ru and Pd, or made of a transparent conductive oxide. The metal may be doped, for example with copper when it is aluminium. The structured first electrode E1 may have a thickness comprised between 100 nm and 300 nm. The structured first electrode E1 may be covered with a passivation layer. By way of nonlimiting example, the passivation layer may be made of TiN, and preferably has a thickness smaller than 10 nm.

The structured first electrode E1 is preferably an anode. However, the first electrode E1 may be a cathode if the structure of the stack 5 of organic light-emitting layers is inverted.

Step a) may comprise the following steps:

$a_1$) providing the substrate 1;

$a_2$) depositing the first electrode E1 on the substrate 1 by wafer-scale deposition, using a deposition technique known to those skilled in the art;

$a_3$) structuring the first electrode E1 by mask transfer.

The patterns of the structured first electrode E1 are preferably separated by a width comprised between 0.6 μm and 1 μm. This width allows a pitch, which is preferably comprised between 4 μm and 5 μm, to be obtained for a matrix array of subpixels of the micro-display.

When the architecture is a bottom-emitting architecture, the structured first electrode E1 has a thickness chosen so that it is semi-transparent in the visible domain. The first electrode E1 may then, for example, be made of a transparent conductive oxide (e.g. ITO). When the architecture is a top-emitting architecture, the structured first electrode E1 has a thickness chosen so that it is reflective in the visible domain. The first electrode E1 may then, for example, be made of a metal.

Forming the Bilayer Stacks

The first material is advantageously a zinc oxide ZnO, which is preferably doped with aluminium. The second material is advantageously tin oxide $SnO_2$. First and second materials possessing refractive indices that are sufficiently close to prevent reflections at the interface between the first and second layers 20, 21; 30, 31 of the bilayer stacks 2, 3, will advantageously be chosen. By way of example, the first and second materials advantageously possess refractive indices that differ by 25% or less, and preferably by 20% or less.

Step b) is executed using deposition techniques known to those skilled in the art, for example ALD (acronym of atomic layer deposition).

Step b) is advantageously executed so that:

the first layer 20, 30 of each bilayer stack 2, 3 has a thickness comprised between 10 nm and 100 nm, the second layer 21, 31 of each bilayer stack 2, 3 has a thickness smaller than or equal to 10 nm.

Etching the Bilayer Stacks

Step c) advantageously comprises the following steps:

$c_1$) etching the tin oxide $SnO_2$ of the second bilayer stack 3 with a dry or wet etch, $c_2$) etching the zinc oxide ZnO of the second bilayer stack 3 with a wet etch.

Step $c_1$) is illustrated in FIG. 5. Step $c_2$) is illustrated in FIG. 6.

Figure 10:
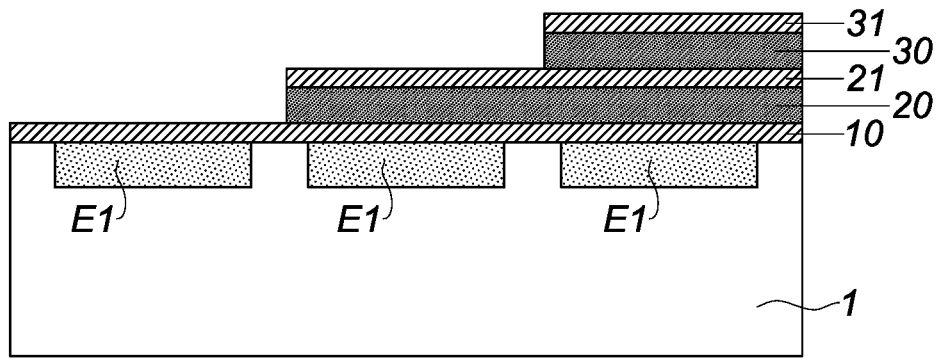

Step c) advantageously comprises a step $c_0$) consisting in masking the zone intended to accommodate the red subpixel PR with a photoresist 6. Step $c_0$) is illustrated in FIG. 4. As illustrated in FIG. 10, the photoresist 6 is removed before step e) using a stripping technique known to those skilled in the art.

Step $c_1$) is executed with an etchant allowing the tin oxide $SnO_2$ to be selectively etched with respect to the zinc oxide ZnO. In step $c_1$), the first layer 30 of the second bilayer stack 3 acts as a stop layer for the etch of the second layer 31 of the second bilayer stack 3. Alternatively, it is possible to provide a thickness of ZnO (i.e. the first layer 30 of the second bilayer stack 3) that is sufficiently large to compensate for any over etching of the $SnO_2$ (i.e. the second layer 31 of the second bilayer stack 3).

Step $c_2$) is executed with an etchant (for example hydrofluoric acid (HF) 0.1%) allowing the zinc oxide ZnO to be selectively etched with respect to the tin oxide $SnO_2$. In step $c_2$), the second layer 21 of the first bilayer stack 2 acts as a stop layer for the etch of the first layer 30 of the second bilayer stack 3.

Step d) advantageously comprises the following successive steps:

$d_1$) etching the tin oxide $SnO_2$ of the first bilayer stack 2 with a dry or wet etch, $d_2$) etching the zinc oxide ZnO of the first bilayer stack 2 with a wet etch.

Step $d_1$) is illustrated in FIG. 8. Step $c_2$) is illustrated in FIG. 9.

Step d) advantageously comprises a step do) consisting in masking the zone intended to accommodate the green subpixel PV with a photoresist 6. Step do) is illustrated in FIG. 7. As illustrated in FIG. 10, the photoresist 6 is removed before step e) using a stripping technique known to those skilled in the art.

Step $d_1$) is executed with an etchant allowing the tin oxide $SnO_2$ to be selectively etched with respect to the zinc oxide ZnO. In step $d_1$), the first layer 20 of the first bilayer stack 2 acts as a stop layer for the etch of the second layer 21 of the first bilayer stack 2.

Step $d_2$) is executed with an etchant allowing the zinc oxide ZnO to be selectively etched with respect to the tin oxide $SnO_2$. In step $d_2$), the intermediate layer 10 acts as a stop layer for the etch of the first layer 20 of the first bilayer stack 2.

Intermediate Layer

Figure 2:
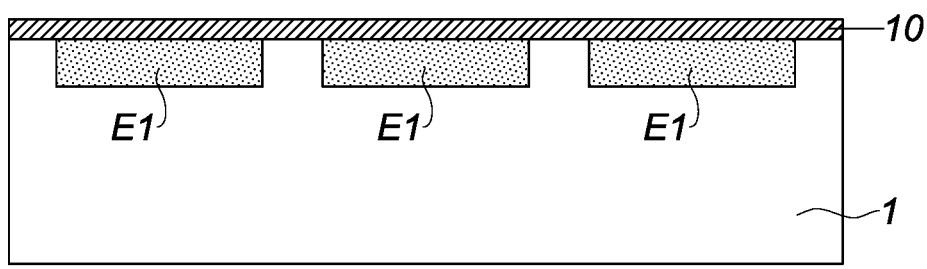

As illustrated in FIG. 2, step a) advantageously comprises a step $a_4$) consisting in coating the structured first electrode E1 with an intermediate layer 10 made of the second material. Step $a_4$) is carried out using a deposition technique known to those skilled in the art, ALD for example. The intermediate layer 10 is thus intermediate between the structured first electrode E1 and the first bilayer stack 2. The intermediate layer 10 has a thickness chosen so that the optical resonator permits the transmission of blue light.

Step b) is then executed so that:
the first bilayer stack 2 and the intermediate layer 10 have a total thickness chosen so that the optical resonator permits the transmission of green light,
the first and second bilayer stacks 2, 3 and the intermediate layer 10 have a total thickness chosen so that the optical resonator permits the transmission of red light.

Such an intermediate 10, made of tin oxide $SnO_2$, allows the structured first electrode E1 to be protected from air and moisture. Furthermore, such an intermediate layer 10 partially contributes to forming the spacer layer of the optical resonator.

Electrical Insulation of the Subpixels

Figure 11:
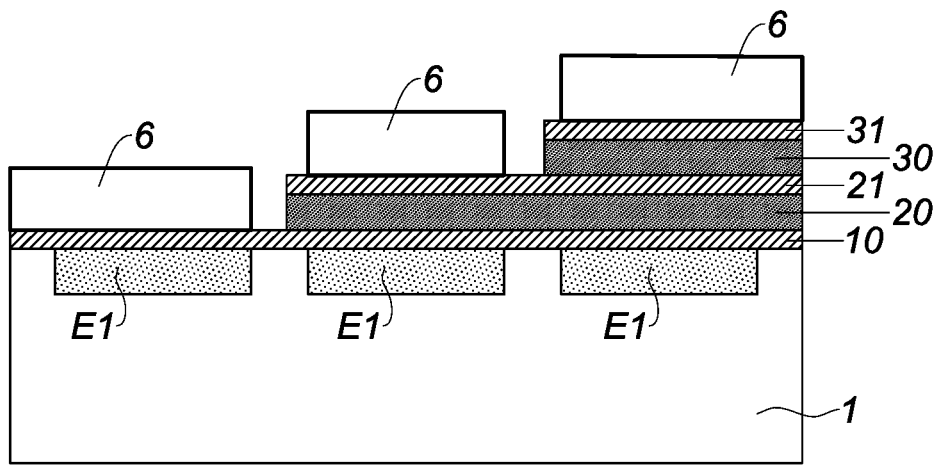
Figure 12:
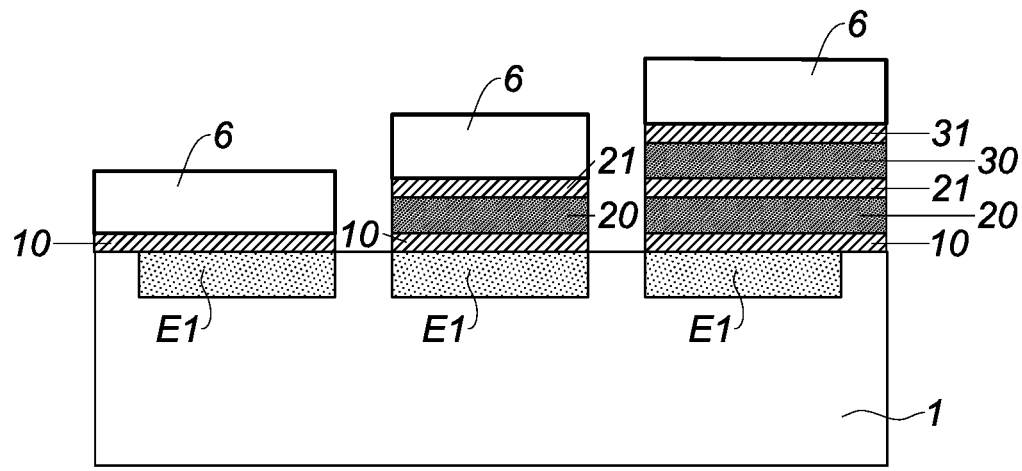

As illustrated in FIGS. 11 and 12, step e) is advantageously preceded by a step $e_0$) consisting in etching the first and second bilayer stacks 2, 3 in the zones intended to lie between the red, green and blue subpixels PR, PV, PB. Step $e_0$) is preferably a step of dry etching. Step $e_0$) is illustrated in FIG. 12.

An etchant allowing the first and second bilayer stacks 2, 3 to be simultaneously (and non-selectively) etched in the zones intended to lie between the red, green and blue subpixels PR, PV, PB will preferably be chosen, in order to decrease the length of the process. By way of nonlimiting example, the etchant may be hydroiodic acid. According to one alternative, step $e_0$) may be a step of reactive ion etching (RIE), preferably with a chlorine-based chemistry (e.g. $Cl_2$/Ar).

Figure 13:
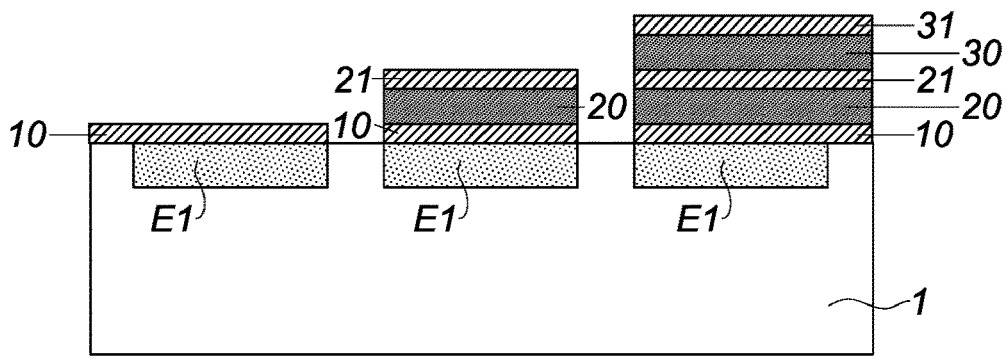

As illustrated in FIG. 11, step $e_0$) comprises beforehand a step consisting in masking with the zones intended to lie between the red, green and blue subpixels PR, PV, PB with a photoresist 6. As illustrated in FIG. 13, the photoresist 6 is removed before step e) using a stripping technique known to those skilled in the art.

Figure 16:
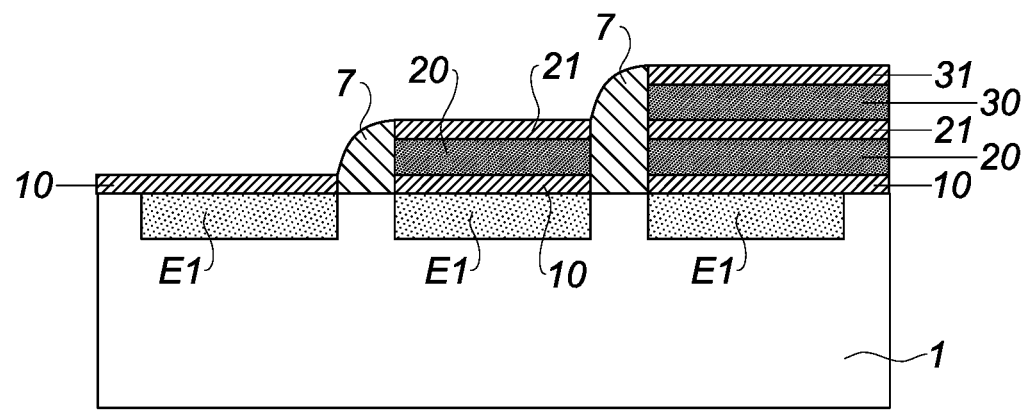
FIG. 16 is a schematic cross-sectional view cut normal to the substrate, illustrating one step of a process according to the invention.
Figure 17:
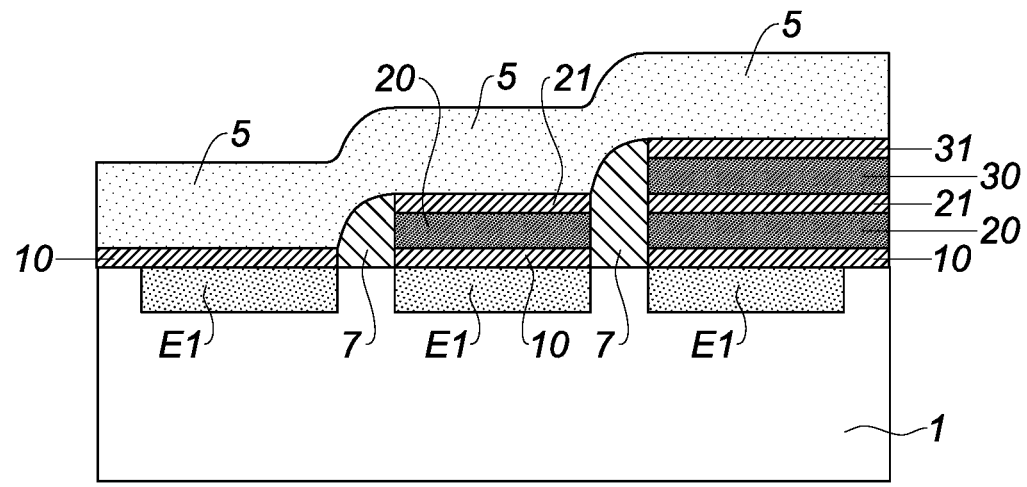
FIG. 17 is a schematic cross-sectional view cut normal to the substrate, illustrating one step of a process according to the invention.

Step $e_0$) may be followed by a step (illustrated in FIGS. 16 and 17) consisting in filling the zones intended to lie between the red, green and blue subpixels PR, PV, PB with a dielectric 7, for example taking the form of a resist. By way of nonlimiting example, the dielectric 7 may be an insulating resist deposited by spin coater and subjected to photolithography in order to leave resist pads only between two adjacent subpixels. A good electrical insulation between the red, green and blue subpixels PR, PV, PB is achieved thereby.

Stack of Organic Light-Emitting Layers

The stack 5 of organic light-emitting layers formed in step c) has a constant thickness in each red, green and blue subpixel PR, PV, PB.

By way of nonlimiting example, the stack 5 of organic light-emitting layers may comprise three emissive layers of tandem architecture. More precisely, when the structured first electrode E1 is an anode and the second electrode E2 is a cathode, the stack 4 may comprise:
a first hole-transport layer formed on the structured first electrode E1;
a first emissive layer that emits blue light and that is formed on the first hole-transport layer;
a first electron-transport layer formed on the first emissive layer;
a charge-generating layer (also called an interconnection layer) formed on the first electron-transport layer;
a second hole-transport layer formed on the charge-generating layer;
a second emissive layer that emits green light and that is formed on the second hole-transport layer;
a third emissive layer that emits red light and that is formed on the second emissive layer;
a second electron-transport layer formed on the third emissive layer and intended to be coated with the second electrode E2.

By way of variants, the stack 5 of organic light-emitting layers may comprise:
three emissive layers that respectively emit blue, green and red light without being arranged in a tandem architecture (conventional structure);
two emissive layers that respectively emit yellow and blue light and that are arranged in a conventional structure;
two emissive layers that respectively emit yellow and blue light and that are arranged in a tandem structure.

Step e) is executed using deposition techniques known to those skilled in the art.

Second Electrode

The second electrode E2 is advantageously made of a metal, and preferably one selected from Al, Ag, Pt, Cr, Ni and W, or made of a transparent conductive oxide.

The second electrode E2 is preferably a cathode. However, the second electrode E2 may be an anode if the structure of the stack 5 of organic light-emitting layers is inverted.

Step f) is executed using a deposition technique known to those skilled in the art.

The second electrode E2 is advantageously coated with an encapsulation layer (not illustrated) suitable for protecting from air and from moisture the second electrode E2 and the stack 5 of organic light-emitting layers.

When the architecture is a bottom-emitting architecture, the second electrode E2 has a thickness chosen so that it is reflective in the visible domain. The second electrode E2 may then for example be made of a metal. When the architecture is a top-emitting architecture, the second electrode E2 has a thickness chosen so that it is semi-transparent in the visible domain. The second electrode E2 may then for example be made of a transparent conductive oxide (e.g. ITO).

The invention is not limited to the described embodiments. Anyone skilled in the art will be able to envision technically workable combinations, and to substitute equivalents thereof.

The invention claimed is:

1. A process for manufacturing a pixel of an organic-light-emitting-diode micro-display, comprising the following successive steps:
a) providing a substrate comprising a structured first electrode;

b) forming in succession first and second bilayer stacks on the structured first electrode, each bilayer stack comprising in succession first and second layers respectively made of first and second materials that are transparent conductive oxides able to be selectively etched;

c) etching the second bilayer stack in a zone configured to accommodate a blue subpixel and in a zone configured to accommodate a green subpixel, the second bilayer stack being left intact under a zone configured to accommodate a red subpixel;

d) etching the first bilayer stack in the zone configured to accommodate the blue subpixel, the first bilayer stack being left intact under the zone configured to accommodate the green subpixel;

e) forming a stack of organic light-emitting layers, said stack being configured to emit white light and extending through the zones configured to accommodate the red, green and blue subpixels;

f) forming a second electrode on the stack of organic light-emitting layers so as to obtain an optical resonator with the first electrode;

step b) being executed so that:
the first bilayer stack has a thickness chosen so that the optical resonator permits the transmission of green light,
the first and second bilayer stacks have a total thickness chosen so that the optical resonator permits the transmission of red light.

2. The process according to claim 1, wherein step a) comprises a step comprising coating the structured first electrode with an intermediate layer made of the second material, the intermediate layer having a thickness chosen so that the optical resonator permits the transmission of blue light;

step b) being executed so that:
the first bilayer stack and the intermediate layer have a total thickness chosen so that the optical resonator permits the transmission of green light,
the first and second bilayer stacks and the intermediate layer have a total thickness chosen so that the optical resonator permits the transmission of red light.

3. The process according to claim 1, wherein the first material is a zinc oxide ZnO, doped with aluminium, and the second material is tin oxide SnO2.

4. The process according to claim 3, wherein step c) comprises the following successive steps:

$c_1$) etching the tin oxide $SnO_2$ of the second bilayer stack with a dry or wet etch, $c_2$) etching the zinc oxide ZnO of the second bilayer stack with a wet etch.

5. The process according to claim 3, wherein step d) comprises the following successive steps:

$d_1$) etching the tin oxide SnO2 of the first bilayer stack with a dry or wet etch, $d_2$) etching the zinc oxide ZnO of the first bilayer stack with a wet etch.

6. The process according to claim 1, wherein step c) comprises a step c0) comprising masking the zone configured to accommodate the red subpixel with a photoresist.

7. The process according to claim 1, wherein step d) comprises a step $d_0$) comprising masking the zone configured to accommodate the green subpixel with a photoresist.

8. The process according to claim 1, wherein step e) is preceded by a step e0) comprising etching the first and second bilayer stacks in the zones configured to lie between the red, green and blue subpixels.

9. The process according to claim 1, wherein step b) is executed so that:
the first layer of each bilayer stack has a thickness comprised between 10 nm and 100 nm,
the second layer of each bilayer stack has a thickness smaller than or equal to 10 nm.

10. The process according to claim 1, wherein the first and second electrodes are made of a metal, selected from Al, Ag, Pt, Cr, Ni and W, and/or made of a transparent conductive oxide.

11. The process according to claim 1, wherein:
the substrate provided in step a) is transparent in the visible domain,
the structured first electrode provided in step a) is semi-transparent in the visible domain,
the second electrode formed in step f) is reflective in the visible domain.

12. The process according to claim 1, wherein:
the substrate provided in step a) is made of a semiconductor, preferably silicon, or made of glass,
the structured first electrode provided in step a) is reflective in the visible domain,
the second electrode formed in step f) is semi-transparent in the visible domain.

* * * * *